United States Patent [19]

Glance

[11] Patent Number: 4,916,705
[45] Date of Patent: Apr. 10, 1990

[54] RANDOM-ACCESS DIGITALLY-TUNED COHERENT OPTICAL RECEIVER

[75] Inventor: Bernard Glance, Colts Neck, N.J.

[73] Assignee: AT&T Bell Laboratories, Murray Hill, N.J.

[21] Appl. No.: 347,121

[22] Filed: May 4, 1989

[51] Int. Cl.$^4$ .............................................. H01S 3/10
[52] U.S. Cl. ...................................... 372/20; 372/26; 372/32
[58] Field of Search ...................... 372/20, 32, 29, 38, 372/26

[56] References Cited

U.S. PATENT DOCUMENTS

| 4,719,636 | 1/1988 | Yamaguchi | 372/20 |
| 4,806,873 | 2/1987 | Nagano | 372/38 |
| 4,829,527 | 5/1987 | Wortman et al. | 372/20 |
| 4,829,535 | 5/1989 | Utaka | 372/32 |

OTHER PUBLICATIONS

Y. Kotaki et al., 1.55 μm Wavelength Tunable FBH-DBR Laser, Electronics Letters, Mar. 26, 1987, vol. 23, No. 7, pp. 325–327.
S. Murata et al., Over 720 GHz (5.8 nm) Frequency Tuning by a 1.5 μm DBR Laser with Phase and Bragg Wavelength Control Regions, Electronics Letters, Apr. 9, 1987, vol. 23, No. 8, pp. 403–405.
T. L. Koch et al., Continuously Tunable 1.5 μm Multiple–Quantum-Well GaInAs/GaInAsP Distributed-- Bragg-Reflector Lasers, Electronics Letters, Nov. 10, 1988, vol. 24, No. 23, pp. 1431–1433.
B. S. Glance et al., Densely Spaced FDM Coherent Star Network with Optical Signals Confined to Equally Spaced Frequencies, Jnl. Lightwave Tech., vol. 6, No. 11, Nov. 1988, pp. 1770–1781.
B. Glance et al., Frequency Stabilisation of FDM Optical Signals Originating from Different Locations, Electronic Letters, Nov. 5, 1987, vol. 23, No. 23, pp. 1243–1245.
B. Glance et al., Frequency Stabilisation of FDM Optical Signals, Electronic Letters, Jul. 2, 1987, vol. 23, No. 14, pp. 750–752.

*Primary Examiner*—James W. Davie
*Attorney, Agent, or Firm*—Richard B. Havill

[57] ABSTRACT

A selectively tunable coherent optical receiver includes a tunable laser for producing a selectable local oscillator frequency for receiving any one of a group of received optical channel signals. The tunable laser is controlled by a feedback loop and a digital processor that stores values of laser bias current. The arrangement produces an exact local oscillator frequency for operating with any one of the group of selectable received channel signals which are spaced over a range of optical carrier frequencies. This receiver avoids frequency sticking and very long pull-in time and determines when there is a missing channel or missing channels.

9 Claims, 3 Drawing Sheets

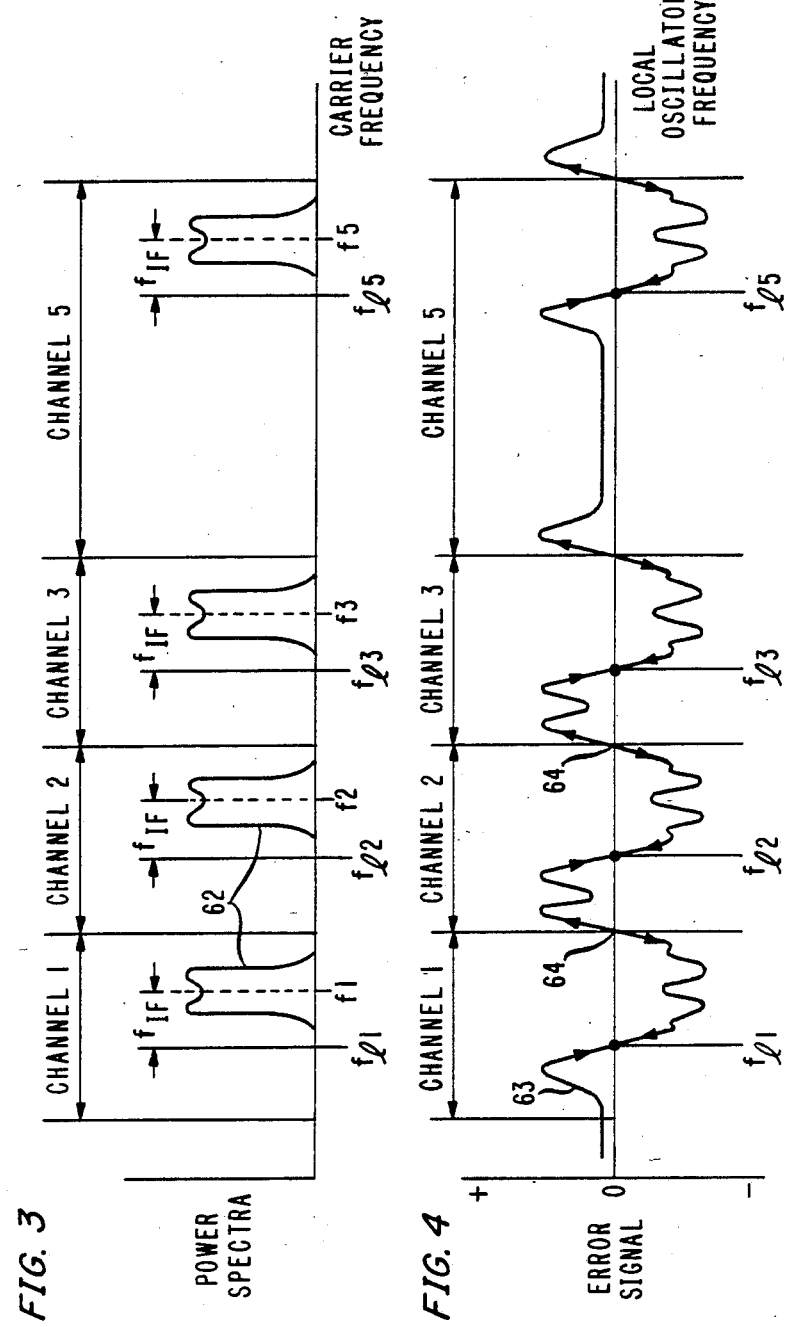

RANDOM-ACCESS DIGITALLY-TUNED COHERENT OPTICAL RECEIVER

This invention relates to an optical receiver arranged for coherent operation.

BACKGROUND OF THE INVENTION

Because of known receiver sensitivity and frequency selectivity advantages, there is a desire to employ coherent detection in optical receivers. Much greater sensitivity and frequency selectivity can be achieved by coherent detection than by the direct detection methods used in the prior art. Some coherent detection schemes have been proposed in the prior art.

In operating prior art coherent optical receivers, it has been difficult to tune a local oscillator laser to oscillate at a frequency that closely tracks whatever optical carrier frequency is received from a transmission medium. Since the development of a tunable distributed Bragg reflection laser, it is possible to tune a local oscillator laser through a wide frequency range and to track each of the channels of a large multi-channel received signal.

For some systems applications, it is desirable to employ several different optical carriers multiplexed together on a common optical media. Receivers in such systems need flexibility in their local oscillator frequency so that they can receive any one of the several different optical channels. In order to select those different optical channels, a coherent receiver must be arranged with a local oscillator laser that can be selectively tuned to any one optical frequency from a set of local oscillator frequencies, associated with the set of received optical carrier frequencies. Heretofore there has been no workable arrangement for generating a selectable set of local oscillator optical frequencies.

In addition to the problem of providing the selectable set of local oscillator frequencies, there is a further problem of compensating the laser bias current that is applied to the local oscillator for any drift which occurs in its operating characteristic as a result of aging, temperature change, or other changes of ambient conditions.

SUMMARY OF INVENTION

These and other problems are resolved by a selectively tunable coherent optical receiver that is controlled by a feedback loop including an active integrator and a digital processor. A laser is tunable to different ones of a selectable set of local oscillator frequencies in response to different values of control signals. The digital processor determines the control signal values which produce the different frequencies of oscillation. Those values are stored in the digital processor for ready retrieval. During operation, one of the control signal values, representing a desired frequency, is retrieved from storage and is applied to the laser. if because of a shifted laser characteristic the retrieved control signal value produces the wrong free-running frequency of oscillation, a control signal error is determined by the feedback loop and is added to the retrieved control signal value. The processor measures the value of the control signal error and derives a total new control signal value that is stored in place of the originally retrieved control signal value.

When the processor determines that the laser characteristic has shifted, the digital processor calculates different control signal values for all of the desired frequencies of operation and stores those new control signal values in the appropriate locations in the digital processor for subsequent selection and use.

As a result, the laser is controlled by readily selectable control signal values which produce the exact desired local oscillator frequencies for detecting information from any one of the received optical channels. Such an optical local oscillator is useful for selectively receiving a desired channel from a plurality of optical channels which are frequency division multiplexed in a common transmission media.

BRIEF DESCRIPTION OF THE DRAWING

The invention may be better understood when the following detailed description is read with reference to the drawing wherein

FIG. 3 shows a power spectra vs carrier frequency response curve for an optical frequency division multiplex arrangement;

FIG. 4 presents an error signal response curve plotted against an optical local oscillator frequency;

DETAILED DESCRIPTION

Figure 1:
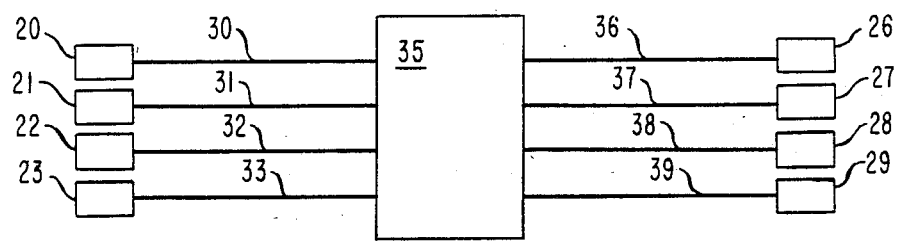
FIG. 1 is a block diagram of an optical frequency division multiplex arrangement.

Referring now to FIG. 1, there is shown a block diagram of an optical frequency division multiplex arrangement for transmitting information from a set of transmitting stations 20, 21, 22 and 23 to a set of receiving stations 26, 27, 28 and 29. Additional transmitting and receiving stations may be included, but only four of each are shown by way of example.

Optical fibers 30, 31, 32 and 33 carry the optical signals, respectively, from the transmitting stations 20, 21, 22 and 23 to an optical star coupler 35. Each of those optical signals includes information modulated on an optical carrier. For example, the transmitting stations 20, 21, 22 and 23 each transmit information on a different optical carrier frequency selected from some number N (where, e.g., N = forty) of available optical carrier frequencies. By choice of an operator, those forty optical carrier frequencies are available from each of the transmitting stations 20, 21, 22 and 23, as described in another patent application (B. Glance 17), filed currently herewith in my name. As a result of interactive controls, only one transmitting station at a time can select any one of the available optical carrier frequencies. Concurrently, the other transmitting stations can be operated at different ones of the carrier frequencies. The transmitting stations are synchronized with one another by a scheme such as the one disclosed in a co-pending patent application, Ser. No. 059,973, filed in my name on June 9, 1987. The teachings of both of the aforementioned patent applications are incorporated herein by reference.

All of the concurrently selected optical carrier frequencies are multiplexed together within the optical star coupler 35. From the star coupler, all concurrently transmitted carriers are forwarded through all of the fibers 36, 37, 38 and 39 to the receiving stations 26, 27, 28 and 29.

Receiving stations 26, 27, 28 and 29 may be operated in either one of two different ways. The first way to operate is to assign each of the receiving stations a predetermined one of the forty optical carrier frequencies. Such predetermined frequency assignments limit the flexibility of the system to the extent that each transmitting station must select the optical carrier frequency which can be received by the desired receiving station. A second way to use the optical carrier frequencies in the receiving stations, is to provide each of the receiving stations with an arrangement which at any time will enable the operator of each receiving station to select for reception, or tune to, nay one of the forty optical carrier frequencies. This way of tuning the receiving stations is the subject of this application.

All of the receiving stations are equipped with a tunable local oscillator laser arrangement wherein the laser can produce any one of forty, for example, optical local oscillator frequencies at the option of the operator. The receiving stations 26, 27, 28, and 29 of FIG. 2 have been arranged to compensate, or correct, automatically for any variation, or drift, in the local oscillator laser or circuit characteristics. Because each receiving station is thus compensated for drift, each operator is assured that nay selection of local oscillator frequency for any receiving station will result in that receiving station operating at the specifically selected local oscillator frequency rather than some other non-selected frequency to which the station otherwise might lock.

A description of the automatic control arrangement of the receiving stations is presented in greater detail hereinafter with reference to FIGS. 2 through 7.

Figure 2:
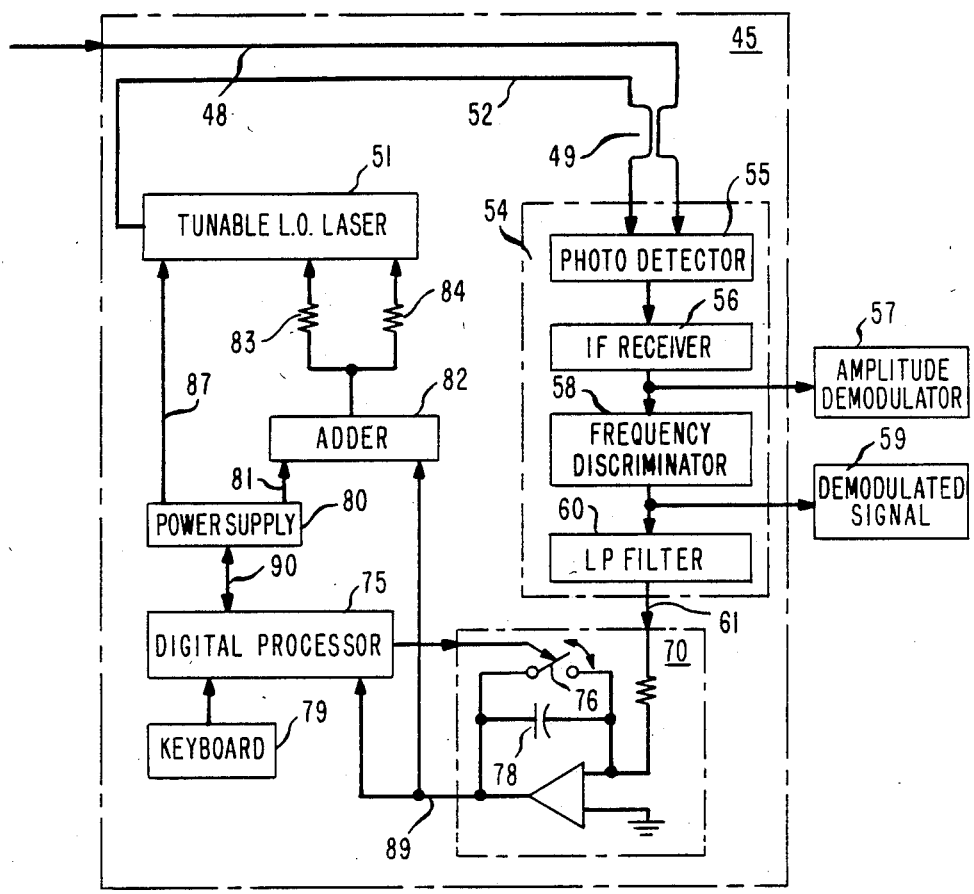
FIG. 2 is a block diagram of a random-access digitally-tuned coherent optical receiver.

Referring now to FIG. 2, there is shown a diagram of a random-access digitally-tuned coherent optical receiver 45, which receives the multiplexed optical carriers by way of an optical fiber 48. This optical receiver 45 can be used for each one of the receiving stations 26, 27, 28 and 29 of FIG. 1. In FIG. 2, the optical receiver 45 includes a distributed Bragg reflector laser 51 which produces a tunable single local oscillator frequency signal that is coupled into an optical fiber, or guide 52. The output of a single frequency laser is essentially in a single longitudinal mode. An optical coupler 49 combines the selected local oscillator optical frequency signal from the guide 52 with the multiplexed optical carriers on the optical fiber 48. The combined optical signals on both fibers 48 and 52 are applied to an essentially electronic arrangement 54 that stabilizes a set of spaced optical local oscillator frequencies of the laser 51 by using the spaced set of carriers of the multiplexed signal received on the fiber 48.

In the arrangement 54, the combined signals are heterodyned by a photodetector 55. The resulting heterodyned signal is an electrical signal that is filtered by an intermediate frequency filter that is located in an intermediate frequency receiver circuit 56. This intermediate frequency receiver circuit 56 produces a selected intermediate frequency channel including any information signal. An amplitude sensitive demodulator 57 responds to the selected intermediate frequency channel to produce a baseband information channel if an amplitude shift keying (ASK) information signal is utilized.

For the amplitude shift keying arrangement, a fraction of the selected intermediate frequency channel signal is used for generating an error signal to control the frequency of oscillation of the local oscillator laser 51. That fraction of the selected intermediate frequency channel signal is applied to a frequency discriminator circuit 58 that is centered at the intermediate frequency $f_{IF}$.

If another information signal scheme, such as frequency shift keying, is utilized, then the entire selected intermediate frequency channel is applied to the frequency discriminator circuit 58. The selected intermediate frequency channel is a demodulated baseband information channel for the frequency shift keying (FSK) information signals, as shown in block 59.

No matter which information signal format is used, the output of the frequency discriminator circuit 58 is filtered and amplified through a low pass filter and amplifier 60 into an error signal on a lead 61. Thus the arrangement 54 generates, on the lead 61, an error signal that is used for locking the local oscillator laser frequency to the selected optical frequency.

In the system of FIG. 1, there is a need to guarantee that the lasers of the receivers will operate at the desired, or selected, local oscillator frequencies.

FIG. 3 presents a curve 62 that is a plot of the power spectra of several multiplexed optical channels vs frequency. The channel energy is shown centered around carrier frequencies f1, f2, f3 and f5. Desired optical local oscillator frequencies for the laser 51 of FIG. 2 are offset from the carrier frequencies by an intermediate frequency $f_{IF}$, as shown in FIG. 3.

In FIG. 4, a curve representing an error signal 63 is plotted on a horizontal axis of local oscillator frequencies which are aligned with the carrier frequencies shown in FIG. 3. Error signal 63 makes both positive and negative polarity excursions within each band of frequencies, defined by the limits of each received channel 1, 2, 3 and 5 of FIG. 3. It is noted that the error signal 63 has a zero cross at each local oscillator frequency $f_{l1}$, $f_{l2}$, $f_{13}$ and $f_{15}$ that is to be used for receiving the respective received channels 1, 2, 3 and 5. Also it is noted that the low pass filter and amplifier 60 of FIG. 2 inserts an offset voltage to the error signal 63 so that the flat portions of the error signal are slightly above zero. The reason for this offset voltage will become clear subsequently.

During regular operation of the optical receiver 45 of FIG. 2, a digital processor 75 is given a desired channel selection, e.g., channel 1, from the available channels 1, 2, 3 and 5. The processor 75 causes a power supply 80 to apply an appropriate bias current or control signal to the laser 51. This bias current is the current value which will cause the laser 51 to oscillate at the local oscillator frequency $f_{11}$ of FIG. 4. A set of such appropriate bias currents is determined for the set of desired local oscillator frequencies $f_{11}$, $f_{12}$, $f_{13}$ and $f_{15}$ and is stored in the digital processor 75 of FIG. 2.

Figure 5:
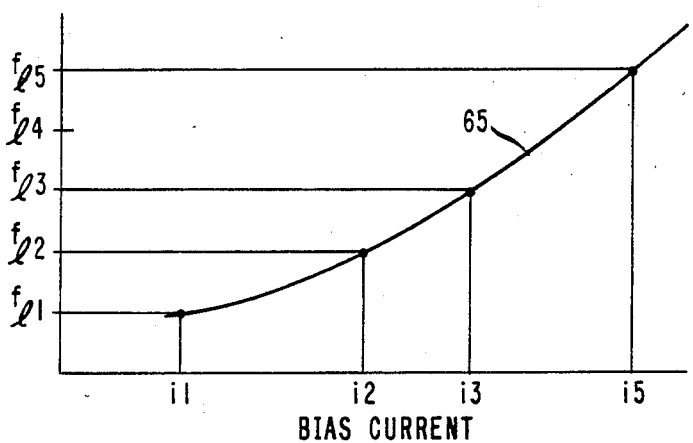
FIG. 5 is an initial frequency vs drive current characteristic curve for a laser.

Referring now to FIG. 5, there is shown a solid line laser characteristic curve 65. Heavy dots on this curve represent the values of laser bias current required to operate the local oscillator laser 51 of FIG. 2 at the frequencies $f_{11}$, $f_{12}$, $f_{13}$ and $f_{15}$, shown in FIG. 4, or at any other desired carrier frequency within a very wide band.

When the optical receiver 45 of FIG. 2 is first operated, it operates along the laser characteristic curve 65 of FIG. 5. Values of laser drive current i1, i2, i3 and i5 for the desired local oscillator frequencies $f_{11}$, $f_{12}$, $f_{13}$ and $f_{15}$ are determined and are stored in the processor 75 of FIG. 2 for subsequent use as the values of laser bias current for determining the desired optical local oscillator frequencies.

For any selected laser, there is a known operating curve. Similarly the optical carriers are known frequencies f1, f2, f3 and f5, as shown in FIG. 3. Information representing the laser operating curve of FIG. 5 is stored in the digital processor 75 of FIG. 2. A set of specific addresses are reserved for storing the values of laser bias current which produce the desired local oscillator frequencies. The relevant values of laser bias current for producing the local oscillator frequencies are determined as follows by a calibration process.

A first local oscillator frequency is selected. From the known laser characteristic curve, an initial laser bias current is selected. The value of that initial laser bias current or control signal is selected to produce a frequency slightly below the first local oscillator frequency, e.g., $f_{11}$. From a keyboard 79 of FIG. 2, the value is put into the digital processor 75 and is read out to the power supply 80 which applies the appropriate value of current by way of a lead 81 to an input of adder 82. That current is divided appropriately by resistors 83 and 84 and the portions are applied respectively to the phase control and distributed Bragg reflector regions of the laser 51. Power supply 80 also directly supplies a constant bias current through a lead 87 to the active region of the laser 51.

The local oscillator laser operates at one intermediate frequency interval from the selected channel frequency.

Since the laser free-running frequency is not at the desired local oscillator frequency, the feedback loop produces an error signal on the lead 61. On a lead 89, an active integrator 70 produces an incremental laser bias current or control signal error which is applied to another input of the adder 82. This incremental laser bias current or control signal error is added to the initially selected laser bias current or control signal and is applied through the resistors 83 and 84 to the laser 51 driving its free-running frequency to oscillate at the desired local oscillator frequency, e.g., $f_{11}$.

The digital processor measures the incremental laser bias current in the lead 89, adds it to the initial laser drive current, and stores the total as a new value of laser bias current or control signal for the local oscillator frequency $f_{11}$.

Similarly an appropriate laser bias current is determined for each of the other desired local oscillator frequencies $f_{12}$, $f_{13}$ and $f_{15}$. The values of those bias currents are stored by the digital processor for subsequent retrieval.

During regular operation, the operator selects the desired local oscillator frequency by inputting a selection through the keyboard 79 to the digital processor. The processor initializes the active integrator 70 and applies a request for the appropriate value of laser bias current through a lead 90 to the power supply 80, which supplies that value of laser bias current through the adder 82 and resistors 83 and 84 to the laser 51. As long as the laser characteristic has not drifted, the laser operates at the desired local oscillator frequency, and no error signal is generated on the lead 61. No incremental laser bias current is generated on the lead 89 by the active integrator 70.

Figure 6:
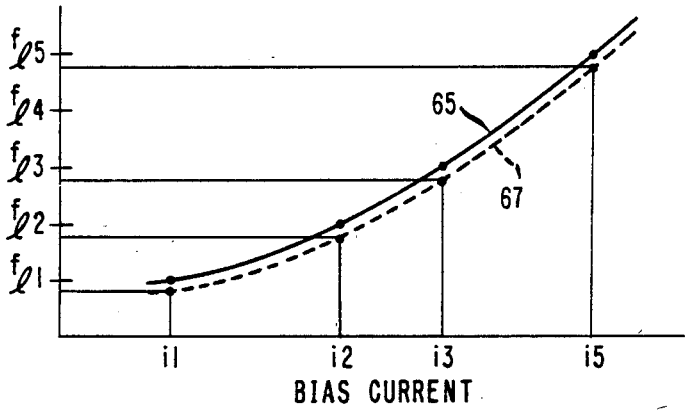
FIG. 6 shows a shifted frequency vs drive current characteristic curve for the laser together with the initial frequency vs drive current characteristic curve.

As a result of device aging or as a result of environmental changes, the laser characteristic curve may change to a different position, for example, as presented by an alternative dashed line characteristic curve 67 of FIG. 6. When the environment of the laser 51 shifts the operating characteristic to the alternative characteristic curve 67, applying the predetermined values of bias current from the original laser characteristic curve 65, will cause an incorrect laser frequency to be selected. Because such changes are expected to occur in the position of the laser characteristic over any long duration of operation in the field, the circuitry included in the laser feedback control loop operates to correct for those changes.

In FIG. 2 a servo-control circuit includes the active integrator 70 which responds to the error signal, for example the error signal on the lead 61, and to signals from the digital processor 75. This servo-control circuit includes a switch 76 placed across a capacitor 78. Charging and discharging of the capacitor 78 is controlled by signals to the switch from the digital processor 75.

Activation of frequency locking is initiated by closing the switch 76 and discharging the capacitor 78. Once the capacitor 78 is discharged, the frequency locking operation is commenced by opening the switch 76. For a selected laser bias current or control signal that produces a laser free-running frequency, the laser frequency varies during the locking process in response to the error signal on the lead 61. As shown by the curve 63 of FIG. 4, the error signal on the lead 61 crosses zero at the local oscillator frequencies $f_{11}$, $f_{12}$, $f_{13}$ and f15. From either side of each of those zero crossings the polarity of the error signal is appropriate to drive the laser to the desired local oscillator frequency. In response to the error signal on the lead 61, the active integrator circuit 70 commences to charge the capacitor 78 and develop the incremental bias current or control signal error on the lead 89. This incremental bias current is added by the adder 82 to the selected laser bias current on the lead 81. The resulting total laser bias current drives the laser to oscillate at the desired local oscillator frequency. The frequency function is the frequency produced by the laser bias current selected from the power supply 80 in response to the digital processor 75 plus the integral of the error signal and the offset voltage.

When the laser free-running frequency is oscillating at the desired local oscillator frequency, no error current is produced. The digital processor measures, reads or otherwise determines the value of the incremental laser bias current or control signal error in the lead 89, adds it to the presently stored value of bias current or control signal, and then stores the new total bias current for subsequent retrieval of a laser drive current for that selected local oscillator frequency.

Inclusion of the active integrator 70 of FIG. 2 extends the pull-in range of the circuit beyond the steep slope between peaks of the error signal 63 of FIG. 4 at the zero-crossing $f_{11}$. The pull-in range is extended to the entire range across each of the defined channels. Because of the offset current, or voltage, the frequency locking arrangement avoids frequency sticking, or a very long pull-in time which can otherwise be caused by the low amplitude of a non-offset error signal. Additionally, the processor can determine by the magnitude of the error signal when there is a missing channel or missing channels.

Each local oscillator frequency has a capture range that equals the frequency range between zero-crossings, 64.

Figure 7:
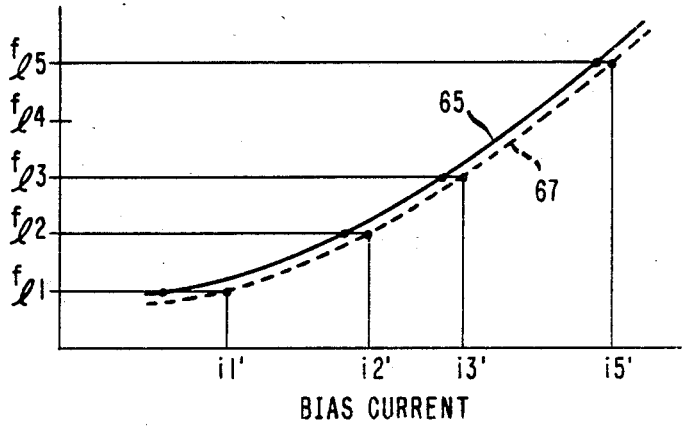
FIG. 7 shows how the arrangement of FIG. 2 compensates for the shifted characteristic curve of FIG. 6 so that the local oscillator laser operates at the desired frequencies selected from the initial characteristics curve of FIG. 5.

Importantly, the just described feedback loop of FIG. 2 informs the digital-processor 75 of any drift of the laser operating characteristic. For instance, by reference to FIG. 6, the characteristic may drift from the initial characteristic curve 65 to the alternative characteristic curve 67. When the incremental laser bias current occurs in the lead 89 of FIG. 2 causing the digital processor 75 to recalculate the value of stored bias current i1, e.g., i1' of FIG. 7, for the selected local oscillator frequency, e.g., fe1, the displacement of the curve 67 of FIG. 6 shows that all of the other stored values of laser bias currents i2, i3 and and i5 would fail to produce the desired local oscillator laser frequencies fe2, fe3 and fe5, respectively. Using the stored characteristic curve data and the known incremental laser bias current, the digital processor 75 calculates and stores new values of laser bias currents i2', i3', and i5' for the frequencies fe2, fe3 and fe5, respectively, as shown in FIG. 7. Thereafter when any desired local oscillator frequency is selected for use, the digital processor 75 will cause the laser bias current supplied to the laser to be very close to the correct value for the desired local oscillator frequency.

The foregoing describes an embodiment of a random-access digitally-tuned coherent optical receiver. This embodiment together with others, which are obvious in view thereof, are within the scope of the appended claims.

I claim:

1. A laser control arrangement for tuning a local oscillator laser, the arrangement comprising
   a laser tunable, via a control signal, to a selectable set of local oscillator frequencies, spaced apart over a range of frequencies;
   means, responsive to selected ones of the set of local oscillator frequencies mixed with a received optical signal including plural optical channels, for determining a set of values of control signal to produce the selectable set of local oscillator frequencies;
   means for storing the set of values of control signal; and
   means for selecting one of the stored values of control signal to drive the laser to a desired one of the set of local oscillator frequencies.

2. A laser control arrangement, in accordance with claim 1, further comprising
   means for determining any difference between a free-running local oscillator frequency of the laser and the desired local oscillator frequency;
   means for determining a control signal error to correct the difference between the free-running local oscillator frequency and the desired local oscillator frequency; and
   means for adding the control signal error to the selected control signal for driving the laser.

3. A laser control arrangement, in accordance with claim 2, further comprising
   means for storing information representing the operating characteristic of the laser; and
   if the control signal error determining means determines a control signal error for the selected local oscillator frequency, a processor determines and stores a new set of values of control signal to produce the selectable set of local oscillator frequencies.

4. A laser control arrangement, in accordance with claim 2, wherein
   the frequency difference determining means comprise
   at least one photodetector for heterodyning the selected local oscillator signal with the received optical signal including plural optical channels to produce a heterodyned signal including an intermediate frequency signal;
   means for filtering the heterodyned signal into an intermediate frequency channel including an information signal; and
   means for demodulating the intermediate frequency channel into a baseband information channel including the information signal.

5. A laser control arrangement, in accordance with claim 4 wherein
   the control signal error determining means comprise
   means for frequency discriminating the intermediate frequency channel into an amplitude modulated channel;
   means for filtering the amplitude modulated channel into an error signal; and
   means for integrating the error signal into the control signal error.

6. A laser control arrangement, in accordance with claim 5, further comprising
   means for adding an offset to the error signal and avoiding frequency sticking.

7. A laser control arrangement, in accordance with claim 2, wherein
   the frequency difference determining means comprise
   at least one photodetector for heterodyning the selected local oscillator signal with the received optical signal including plural optical channels to produce a heterodyned signal including an intermediate frequency signal;
   means for filtering the heterodyned signal into an intermediate frequency channel including an information signal; and
   means for frequency discriminating the intermediate frequency channel into an amplitude modulated channel; and
   means for demodulating the amplitude modulated channel into a baseband information channel including the information signal.

8. A laser control arrangement, in accordance with claim 7, wherein
   the control signal error determining means comprise
   means for filtering the amplitude modulated channel into an error signal; and
   means for integrating the error signal into the control signal error.

9. A laser control arrangement, in accordance with claim 8, further comprising
   means for adding an offset to the error signal and avoiding frequency sticking.

* * * * *